(12) United States Patent  (10) Patent No.: US 9,040,347 B2
Tao et al.  (45) Date of Patent: May 26, 2015

(54) FAN-OUT HIGH-DENSITY PACKAGING METHODS AND STRUCTURES

(75) Inventors: Yujuan Tao, Nantong (CN); Lei Shi, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 13/984,889

(22) PCT Filed: Mar. 22, 2012

(86) PCT No.: PCT/CN2012/072766
§ 371 (c)(1),
(2), (4) Date: Aug. 12, 2013

(87) PCT Pub. No.: WO2012/126375
PCT Pub. Date: Sep. 27, 2012

(65) Prior Publication Data
US 2013/0313699 A1    Nov. 28, 2013

(30) Foreign Application Priority Data

Mar. 22, 2011  (CN) .......................... 2011 1 0069815
Mar. 22, 2011  (CN) .......................... 2011 1 0069819
Mar. 22, 2011  (CN) .......................... 2011 1 0069836
Mar. 22, 2011  (CN) .......................... 2011 1 0069977

(51) Int. Cl.
*H01L 21/00*     (2006.01)
*H01L 23/498*    (2006.01)
*H01L 23/538*    (2006.01)
(Continued)

(52) U.S. Cl.
CPC ..... *H01L 23/49822* (2013.01); *H01L 23/49816* (2013.01); *H01L 23/5389* (2013.01); *H01L 23/3128* (2013.01); *H01L 21/563* (2013.01); *H01L 24/24* (2013.01); *H01L 2224/16225* (2013.01); *H01L 2224/32225* (2013.01); *H01L 2224/48227* (2013.01);
(Continued)

(58) Field of Classification Search
USPC ............ 438/107, 127; 257/E21.499, E21.503
See application file for complete search history.

(56) References Cited

U.S. PATENT DOCUMENTS

2007/0262436 A1    11/2007  Kweon et al.

FOREIGN PATENT DOCUMENTS

| CN | 2664198 Y | 12/2004 |
| CN | 101330068 A | 12/2008 |
| CN | 101604638 A | 12/2009 |

*Primary Examiner* — Amar Movva
(74) *Attorney, Agent, or Firm* — Anova Law Group, PLLC

(57) ABSTRACT

A fan-out high-density packaging method includes providing a packaging substrate, forming a stripping film on the packaging substrate, and forming a first protection layer on the stripping film and pre-designed photolithography pattern openings on the first protection layer. The method also includes forming a metal redistribution layer on the surface of the first protection layer and in the photolithography pattern openings, forming a second protection layer on the first protection layer and partially exposing the metal redistribution layer, and forming at least one package layer on the second protection layer. Each of at least one package layer includes a straight mounting layer, a sealant layer, and a wiring layer formed in sequence, and the package layer connects the metal redistribution layer through the wiring layer. Further, the method includes forming at least one top-level package layer on top of the at least one package layer, removing the packaging substrate and the stripping film to expose the metal redistribution layer in the first protection layer, and planting metal solder balls on the exposed metal redistribution layer.

15 Claims, 7 Drawing Sheets

(51) Int. Cl.
*H01L 23/31* (2006.01)
*H01L 21/56* (2006.01)
*H01L 23/00* (2006.01)
*H01L 21/50* (2006.01)

(52) U.S. Cl.
CPC ........... *H01L 2224/73204* (2013.01); *H01L 2924/15311* (2013.01); H01L 21/50 (2013.01); *H01L 2924/10253* (2013.01); *H01L 2924/30107* (2013.01)

FAN-OUT HIGH-DENSITY PACKAGING METHODS AND STRUCTURES

CROSS-REFERENCES TO RELATED APPLICATIONS

This application claims the priority of Chinese patent application no. 201110069836.3, filed on Mar. 22, 2011, Chinese patent application no. 201110069819.X, filed on Mar. 22, 2011, Chinese patent application no. 201110069815.1, filed on Mar. 22, 2011, and Chinese patent application no. 201110069977.5, filed on Mar. 22, 2011, the entire contents of all of which are incorporated herein by reference.

FIELD OF THE INVENTION

The present invention generally relates to semiconductor technologies and, more particularly, to the methods and structures for fan-out high-density semiconductor packaging.

BACKGROUND

With the continuous development of integrated circuit (IC) technologies, the development trend for electronic products is moving towards more miniaturized and intelligent structures with high performance and high reliability. IC packaging not only has a direct impact on the performance of the integrated circuits, electronic modules, and even the systems, but also restricts the miniaturization, low-cost, and reliability of electronic systems. As the IC chip size keeps decreasing and the integration degree keeps increasing, higher and higher requirements for IC packaging technology are raised by the electronics industry.

Chinese patent publication number CN1747156C discloses a packaging substrate. The disclosed packaging substrate includes: a substrate having a surface; a ball pad located on the substrate surface; a solder mask layer formed on the surface of the substrate, with at least one opening to expose the ball pad; and a patterned metal reinforcing layer formed on the ball pad along the sidewall of the solder mask layer opening. However, when such packaging substrate is used, the system-level packaging integration degree may be still undesired.

Fan-out wafer level packaging is one type of wafer-level packaging technologies. For example, Chinese patent application 200910031885.0 disclosed one wafer-level fan-out chip packaging method, the process steps including: covering the circular carrier substrate surface with a stripping film and a thin film dielectric layer I sequentially, and forming photolithography pattern openings I on the thin film dielectric layer I; forming metal electrodes connecting the substrate and re-wiring metal wires on the photolithography pattern openings I and its surface; covering the surfaces of metal electrodes connecting the substrate, re-wiring metal wires, and thin film dielectric layer I with thin-film dielectric layer II, and forming photolithography pattern openings II on the thin film dielectric layer II; constructing metal electrodes connecting chips on the photolithography pattern openings II; flipping the chips onto the metal electrodes and performing plastic encapsulation and curing to form a packaging structure with a plastic sealant layer; separating the circular carrier substrate and the striping film from the packaging structure with the plastic sealant layer to form a plastic-encapsulated wafer; planting and reflowing balls to form solder balls or bumps; cutting the plastic-encapsulated wafer into individual finished fan-out chip structures.

However, the final products made by the above packaging method may only support a single chip function. To achieve complete system functions, peripheral circuits including capacitors, inductors or resistors may need to be added at the outside of the final products. Further, the above method may be unable to be applied to manufacturing of multi-layer packaging structures with complex connections. Further, when such packaging method is used, the system-level packaging integration degree may be still undesired.

On the other hand, with the trend for light, thin, short, and small products as well as increasingly high demand for system-level functionalities, the integration degree of system-level packaging needs to be further improved. The disclosed methods and systems are directed to solve one or more problems set forth above and other problems.

BRIEF SUMMARY OF THE DISCLOSURE

One aspect of the present disclosure includes a fan-out high-density packaging method. The method includes providing a packaging substrate, forming a stripping film on the packaging substrate, and forming a first protection layer on the stripping film and pre-designed photolithography pattern openings on the first protection layer. The method also includes forming a metal redistribution layer on the surface of the first protection layer and in the photolithography pattern openings, forming a second protection layer on the first protection layer and partially exposing the metal redistribution layer, and forming at least one package layer on the second protection layer. Each of at least one package layer includes a straight mounting layer, a sealant layer, and a wiring layer formed in sequence, and the package layer connects the metal redistribution layer through the wiring layer. Further, the method includes forming at least one top-level package layer on top of the at least one package layer, removing the packaging substrate and the stripping film to expose the metal redistribution layer in the first protection layer, and planting metal solder balls on the exposed metal redistribution layer.

Another aspect of the present disclosure includes a fan-out high-density packaging structure. The packaging structure includes a first protection layer and a metal redistribution layer formed on the surface of the first protection layer and in pre-designed photolithography pattern openings on the first protection layer. The packaging structure also includes a second protection layer formed on the first protection layer and partially exposing the metal redistribution layer, and at least one package layer formed on the second protection layer. Each of at least one package layer includes a straight mounting layer, a sealant layer, and a wiring layer formed in sequence, and the package layer connects the metal redistribution layer through the wiring layer. Further, the packaging structure includes at least one top-level package layer formed on top of the at least one package layer, and metal solder balls planted on an exposed under surface of the metal redistribution layer by removing a packaging substrate and a stripping film formed on the packaging substrate. The first protection layer is formed on the stripping film with the pre-designed photolithography pattern openings on the first protection layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
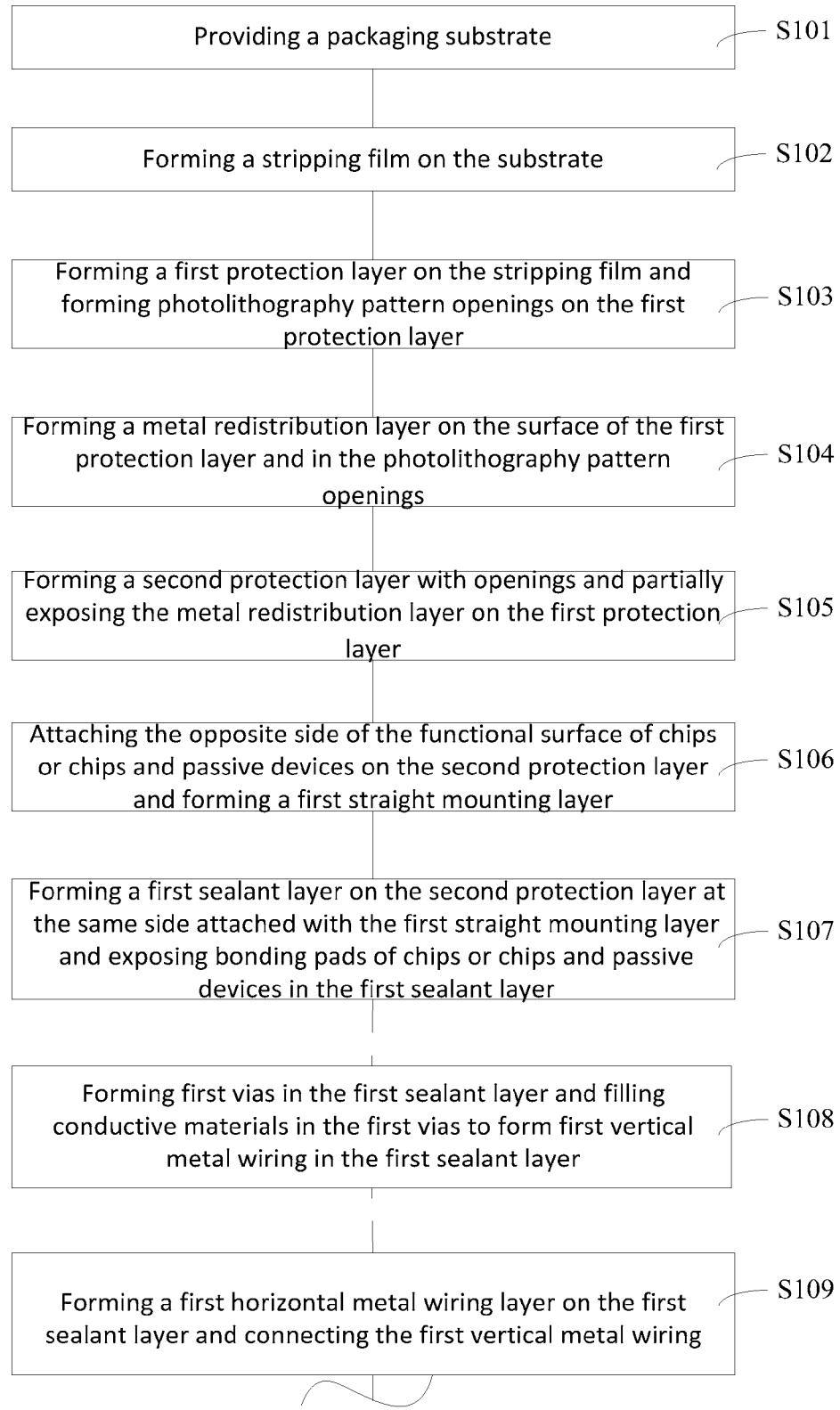
FIGS. 1 and 2 illustrate an exemplary fan-out high-density packaging process consistent with the disclosed embodiments.
Figure 2:
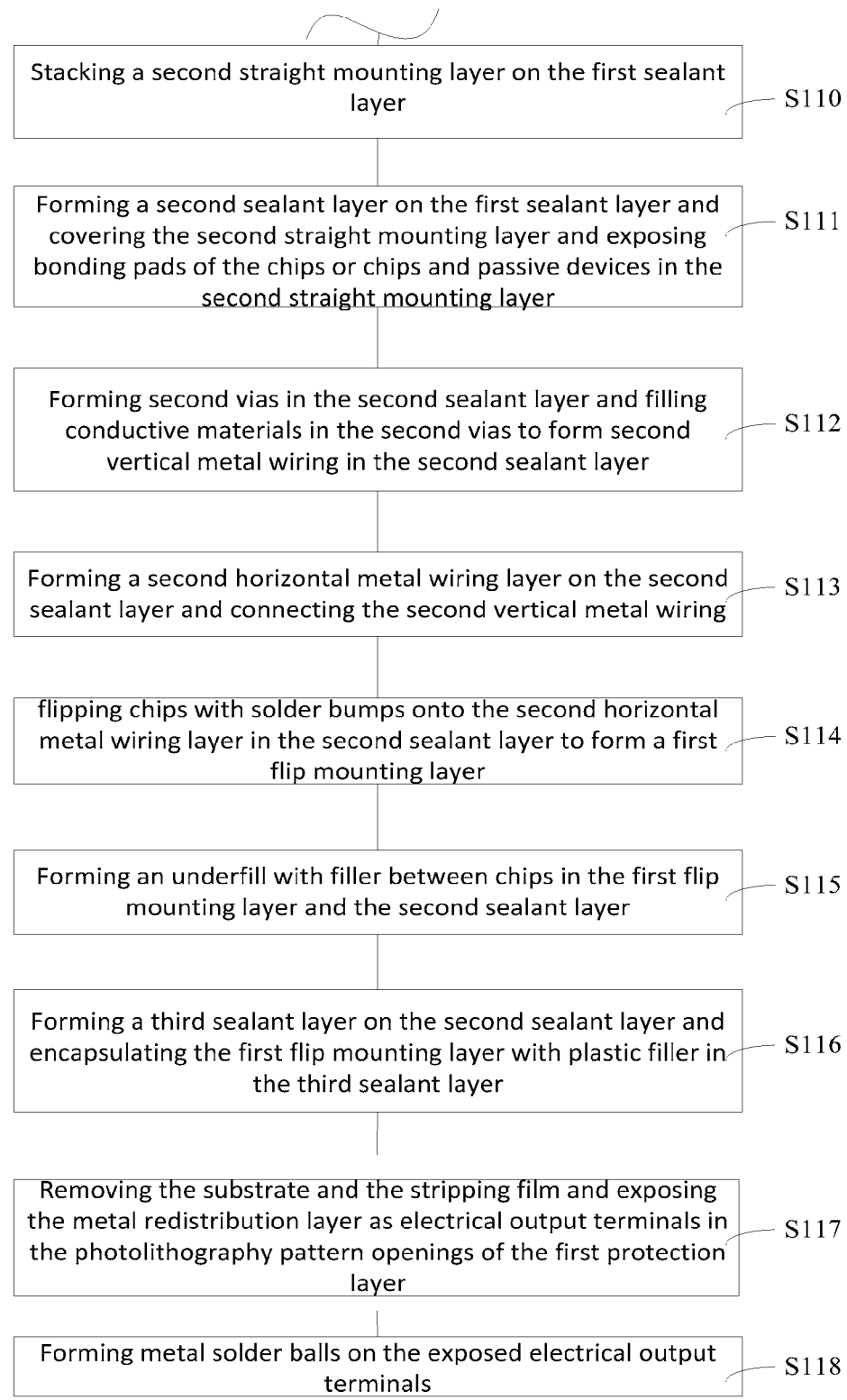
Figure 3:
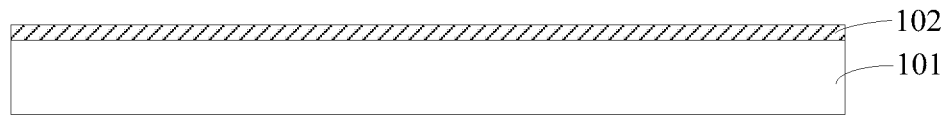
FIGS. 3-13 illustrate exemplary packaging structures corresponding to various steps in the fan-out packaging process consistent with the disclosed embodiments.

FIGS. 1 and 2 illustrate an exemplary fan-out packaging process consistent with the disclosed embodiments. As shown in FIG. 1, at the beginning of the process, a packaging substrate is provided (S101). FIG. 3 shows an exemplary structure corresponding to S101.

As shown in FIG. 3, substrate 101 may include any appropriate material used for IC packaging. For example, substrate 101 may include a silicon wafer substrate or a glass substrate. It may be easy to peel off the substrate materials from the packaging structure, and the materials may be corrosion resistant and may be reused easily. Other types of substrates may also be used. Further, substrate 101 may be configured as the base for subsequently stacking straight mounting layers and may also be configured as the base for carrying subsequent mounting layers.

Returning to FIG. 1, after the substrate 101 is provided (S101), a stripping film is formed on the substrate 101 (S102). FIG. 3 also shows an exemplary structure corresponding to S102.

As shown in FIG. 3, the stripping film 102 may be formed on the top of the substrate 101. The stripping film 102 may be used to affix or attach a first straight mounting layer on the substrate 101. Further, the stripping film 102 may be formed on the substrate 101 by any proper means, such as spin coating or printing.

In certain embodiments, the stripping film 102 may be an ultraviolet (UV) adhesive, such as a UV glue. In the absence of UV irradiation, the UV glue may have desired viscosity for attaching the first straight mounting layer on the substrate 101 and/or other process steps. After UV irradiation, crosslinking chemical bonds in the UV glue are interrupted so that the viscosity of the UV glue may be significantly decreased or disappear. Thus, the substrate 101 may be easily stripped off the packaging structure subsequently using the stripping film 102.

Figure 4:
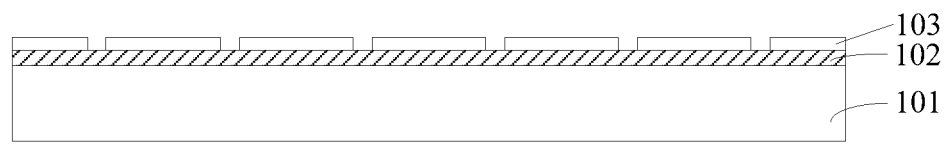

Returning to FIG. 1, after the stripping film 102 is formed on the top of the substrate 101, a first protection layer is formed on the stripping film 102 and pre-designed photolithography pattern openings are then formed on the first protection layer (S103). FIG. 4 shows an exemplary structure corresponding to S103.

As shown in FIG. 4, the first protection layer 103 is formed on the top of the stripping film 102 and pre-designed photolithography pattern openings are then formed on the top of the first protection layer 103. The first protection layer 103 may be made of polyimide or benzocyclobutene. Further, the pre-designed photolithography pattern openings may be formed by photolithography.

Figure 5:
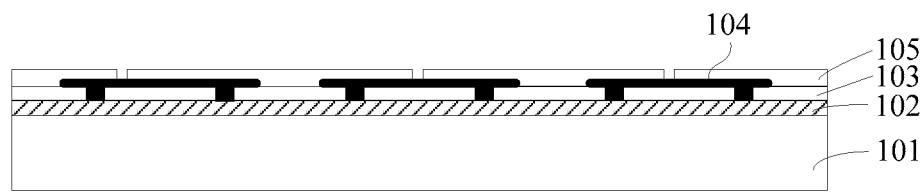

Returning to FIG. 1, after the pre-designed photolithography pattern openings are formed on the top of the first protection layer 103, a metal redistribution layer is formed on the surface of the first protection layer 103 and in the photolithography pattern openings (S104). FIG. 5 shows an exemplary structure corresponding to S104.

As shown in FIG. 5, the metal redistribution layer 104 is formed on the surface of the first protection layer 103 and in the photolithography pattern openings. The metal redistribution layer 104 in the photolithography pattern openings constitutes electrical output terminals after the substrate 101 and the stripping film 102 are subsequently removed. Further, the metal redistribution layer 104 on the surface of the first protection layer 103 may be used to connect the electrical output terminals and subsequent upper wiring layers. The metal redistribution layer 104 may be formed by any appropriate means, such as electroplating, chemical-plating, or sputtering.

Returning to FIG. 1, after the metal redistribution layer 104 is formed on the surface of the first protection layer 103 and in the photolithography pattern openings, a second protection layer is formed on the first protection layer 103 and partially exposes the metal redistribution layer 104 (S105). FIG. 5 shows an exemplary structure corresponding to S105.

As shown in FIG. 5, the second protection layer 105 is formed on the top of the first protection layer 103 and partially exposes the metal distribution layer 104. Similar to the first protection layer 103, the second protection layer 105 may also be made of polyimide or benzocyclobutene.

Figure 6:
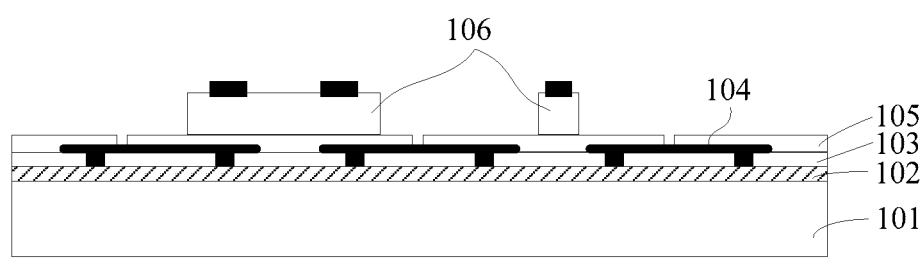

Returning to FIG. 1, after the second protection layer 105 is formed, a first straight mounting layer may be formed on the second protection layer 105 (S106). More particularly, the opposite side of the functional surface of chips and passive devices in the first straight mounting layer is attached on the second protection layer 105 to form the first straight mounting layer on the second protection layer 105 (S106). FIG. 6 shows an exemplary structure corresponding to S106.

As shown in FIG. 6, the chips and passive devices in the first straight mounting layer 106 are attached on the second protection layer 105 at the opposite side of the functional surface of first straight mounting layer 106. As used herein, the functional surface of the first straight mounting layer 106 or any subsequent mounting layer refers to the surface having chip solder pad(s) or bonding pad(s) and passive device solder pad(s) or bonding pad(s).

The first straight mounting layer 106 and any subsequent straight mounting layer may include a chip group containing a single chip or multiple chips. When multiple chips are included, the multiple chips may be of the same type or different types. Similarly, the first straight mounting layer 106 and any subsequent straight mounting layer may include a passive device group containing a single passive device or multiple passive devices. When multiple passive devices are included, the multiple passive devices may be of the same type or different types. Each chip or each passive device may be one part of a system-level packaging structure to achieve one or more separate functions from various system-level functions to be provided by the system-level packaging structures. A mounting layer may include at least one of the chip group and the passive device group.

In the first straight mounting layer 106 and any subsequent straight mounting layer, the passive device may be any appropriate passive device, including one or more capacitors, resistors, and/or inductors.

In the first straight mounting layer 106, arrangement of chips and passive devices may be designed according to the system functions. For example, a chip or chips may be surrounded by same or different other chips and/or surrounded by same or different capacitors, resistors, and inductors. Similarly, a passive devices or passive devices may be surrounded by same or different other passive devices and/or surrounded by one or more same or different chip or chips.

Figure 7:
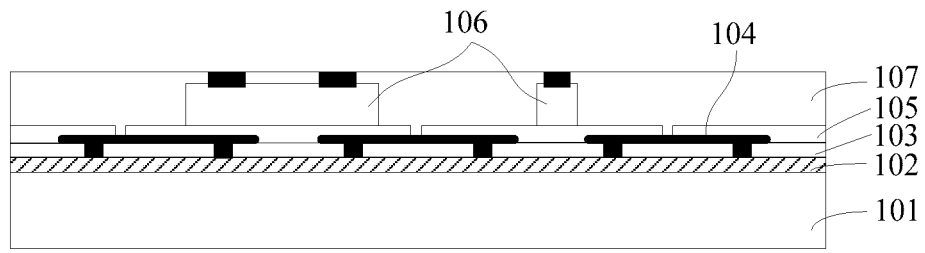

Returning to FIG. 1, after the first straight mounting layer 106 is attached on the second protection layer 105, a first sealant layer is formed on the second protection layer 105 at the same side attached with the first straight mounting layer 106 and exposes bonding pad(s) of chips and/or passive devices in the first straight mounting layer 106 (S107). FIG. 7 shows an exemplary structure corresponding to S107. As used herein, bonding pad(s) of chips and passive devices in the first straight mounting layer 106 or any subsequent mounting layer may be referred as connection parts.

As shown in FIG. 7, the first sealant layer 107 is formed on the top of the second protection layer 105 covering the first straight mounting layer 106 while exposing connection parts in the first straight mounting layer 106. That is, the first sealant layer 107 may cover and insulate or isolate components in the first straight mounting layer 106 with only the connection parts exposed. During subsequent manufacturing processes, the first sealant layer 107 not only can protect the surfaces of the chips and/or passive devices in the first straight mounting layer 106 except the exposed connection parts, but also can serve as a carrier for the subsequent processes. The first sealant layer 107 may also be referred as the first wiring sealant layer.

The first sealant layer 107 may be made of any appropriate materials, and may be formed with an approximately same thickness as that of the first straight mounting layer 106. In one embodiment, the first sealant layer 107 is epoxy. Epoxy may be a desired material for the first sealant layer 107 due to its high sealing performance and easy molding. Further, the first sealant layer 107 may be formed using any appropriate methods including turn injection, compression, or printing.

Figure 8:
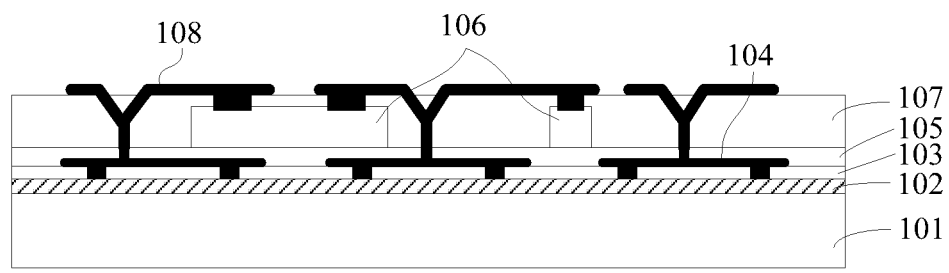

Returning to FIG. 1, after the first sealant layer 107 is formed on the second protection layer 105, first vias are formed in the first sealant layer 107 and conductive material(s) are subsequently filled in the first vias to form first vertical metal wiring in the first sealant layer 107 (S108). FIG. 8 shows an exemplary structure corresponding to S108.

As shown in FIG. 8, the first vias (not labeled) are formed in the second protection layer 105. Conductive materials are subsequently filled in the first vias to form first vertical metal wiring (as shown in FIG. 8, not labeled) in the first sealant layer 107. The first vertical metal wiring may be used to achieve electrical connections between the first straight mounting layer 106 and other subsequent mounting layers.

Further, the first vias may be formed by drilling. The first vias may extend through the first sealant layer 107 and expose the metal redistribution layer 104 to form interconnect channels with the metal redistribution layer 104.

Because the first sealant layer 107 has desired insulating performance, the first vertical metal wiring can be selectively formed in the first sealant layer 107 to achieve interconnects between the mounting layers and between the first straight mounting layer 106 and the metal redistribution layer 104. Component interference in different layers may be reduced or avoided.

Returning to FIG. 1, after the first vertical metal wiring is formed, a first horizontal wiring layer (as shown in FIG. 8, not labeled) is formed on the top of the first sealant layer 107 and connects the first vertical metal wiring (S109). FIG. 8 also shows an exemplary structure corresponding to S109.

As shown in FIG. 8, the first horizontal wiring layer is formed on the top of the first sealant layer 107. The first horizontal wiring layer interconnects with the first vertical metal wiring. Further, the first horizontal wiring layer may be used to achieve electrical connections among components in the first straight mounting layer 106, i.e., interconnections for the first straight mounting layer 106 (e.g., chips and/or passive devices). The first vertical metal wiring and the first horizontal wiring layer may be referred as a first wiring layer 108, and the first wiring layer 108 connects the metal redistribution layer 104 and subsequent upper wiring layers. Further, the first straight mounting layer 106, the first sealant layer 107, and the first wiring layer 108 may be referred as a first package layer.

Figure 9:
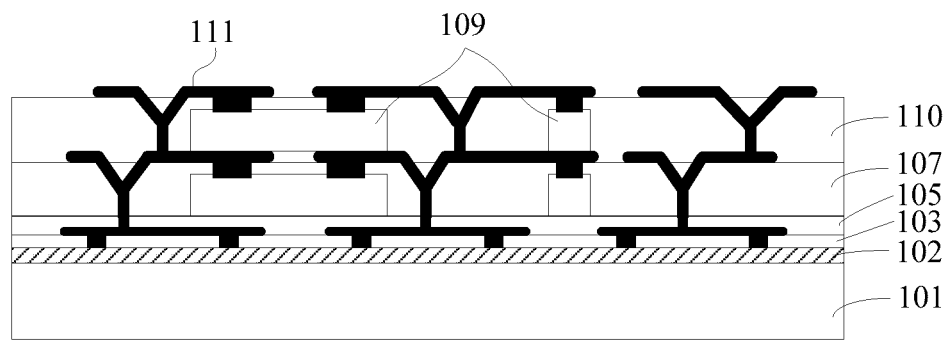

As shown in FIG. 2 (continued from FIG. 1), after the first wiring layer 108 is completed, a second straight mounting layer is stacked on the first sealant layer 107 (S110). FIG. 9 shows an exemplary structure corresponding to S110.

As shown in FIG. 9, the second straight mounting layer 109 is stacked on the first sealant layer 107. The term "stacking", as used herein, refers to placing or attaching the second straight mounting layer 109 on a predetermined location on the first sealant layer 107. Further, the second straight mounting layer 109 may be stacked with functional surface facing up.

Returning to FIG. 2, after the second straight mounting layer 109 is formed, a second sealant layer is formed on the first sealant layer 107 and covers the second straight mounting layer 109 (S111). FIG. 9 shows an exemplary structure corresponding to S111. The second sealant layer 110 may also be referred as the second wiring sealant layer.

As shown in FIG. 9, the second sealant layer 110 is formed on the top of the first sealant layer 107 and covers the second straight mounting layer 109. The second sealant layer 110 is also formed in such a way to expose chip bonding pad(s) and passive device bonding pad(s) in the second straight mounting layer 109. The second sealant layer 110 may include materials similar to the first sealant layer 107, such as epoxy.

Further, returning to FIG. 2, after the second sealant layer 110 is formed, second vias are formed in the second sealant layer 110 and conductive materials are then filled in the second vias to form second vertical metal wiring (S112). FIG. 9 shows an exemplary structure corresponding to S112.

As shown in FIG. 9, second vias (not labeled) are formed in the second sealant layer 110 and conductive materials are then filled in the second vias to form second vertical metal wiring(as shown in FIG. 9, not labeled). Further, the second vias extend through the second sealant layer 110 to partially expose the first horizontal wiring layer of the first package layer to form interconnect channels with the first horizontal wiring layer. Thus, the second vertical metal wiring connects the first wiring layer 108. Further, the second metal vertical wiring may be used to achieve electrical connection between the second straight mounting layer 109 and other mounting layers and between the second straight mounting layer 109 and the metal redistribution layer 104 through the first vias in the first sealant layer 107.

Returning to FIG. 2, after the second vertical metal wiring is formed, a second horizontal wiring layer (as shown in FIG. 9, not labeled) is formed on the second sealant layer 110 (S113). FIG. 9 also shows an exemplary structure corresponding to S113.

As shown in FIG. 9, the second horizontal wiring layer is formed on the top of the second sealant layer 110. The second horizontal wiring layer may be used to achieve electrical connection among components of the second straight mounting layer 109, i.e., interconnections for the second straight mounting layer 109. The second vertical metal wiring and the second horizontal wiring layer may be referred as a second wiring layer 111, and the second wiring layer 111 connects the first wiring layer 108 and/or subsequent upper wiring layers, thus achieving the interconnects of the second straight mounting layer 109 and the first straight mounting layer 106. Further, the second straight mounting layer 109, the second sealant layer 110, and the second wiring layer 111 may be referred as a second package layer.

Figure 10:
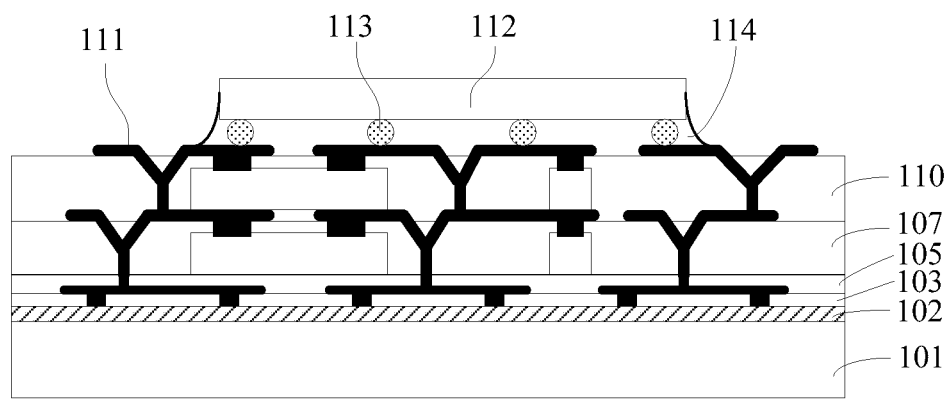

Returning to FIG. 2, after the second wiring layer 111 is completed, a chip or chips with solder bumps are flipped onto the second horizontal metal wiring in second sealant layer 110 to form a first flip mounting layer (S114). FIG. 10 shows an exemplary structure corresponding to S114.

As shown in FIG. 10, the first flip mounting layer 112 is formed by flipping chip(s) with solder bumps onto the second horizontal metal wiring in the second sealant layer 110. The flip chip(s) may connect the second wiring layer 111 through the solder bumps 113, thus achieving the interconnects between the first flip mounting layer 112, the second straight mounting layer 109, and the first straight mounting layer 106.

In one embodiment, passive devices may be mounted around the flip chip(s) in the first flip mounting layer 112 according to system design. To simplify the process, passive devices may be mounted in the same direction as that of the flip chip. That is, passive devices are mounted in the first flip mounting layer 112 with functional surfaces facing down. Further, the bonding pad(s) of the passive devices may be mounted on the predetermined locations on wiring layers to achieve electrical interconnects between passive devices and other components.

Figure 11:
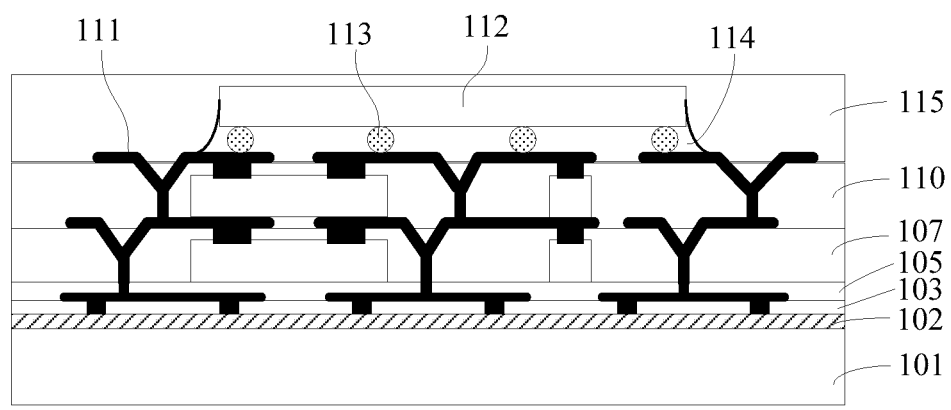

Returning to FIG. 2, after the first flip mounting layer 112 is formed, an underfill is formed by filling filler between the flip chip in the first flip mounting layer 112 and the second sealant layer 110 (S115). FIG. 11 shows an exemplary structure corresponding to S115.

As shown in FIG. 11, the underfill (not labeled) is formed by filling filler 114 between the flipped chip in the first flip mounting layer 112 and the second sealant layer 110. In one embodiment, the filler 114 may be polymer epoxy. Due to its desired viscosity, polymer epoxy may fully fill the space gap between the flip chip and the sealant layer, thus avoiding hollow interior and other reliability problems in the subsequent sealant layers. Further, the filler 114 may be filled by any appropriate means such as dispensing.

Returning to FIG. 2, after the underfill is formed, a third sealant layer is formed on the second sealant layer 110 and covers the first flip mounting layer 112 (S116). FIG. 11 shows an exemplary structure corresponding to S116. The third sealant layer 115 may also be referred as the third wiring sealant layer.

As shown in FIG. 11, the third sealant layer 115 is formed on the top of the second sealant layer 110 and covers the first flip mounting layer 112. The third sealant layer 115 encapsulates the first flip mounting layer 112 with plastic filler or other filling materials. The third sealant layer 115 may provide isolation and insulation for the electronic components in the first flip mounting layer 112. Further, the third sealant layer 115 may be formed using similar materials to the first sealant layer 107 and/or the second sealant layer 110, such as epoxy. The first flip mounting layer 112, the underfill, and the third sealant layer 115 may be referred as a first flip package layer, which is also a top-level package layer.

Figure 12:
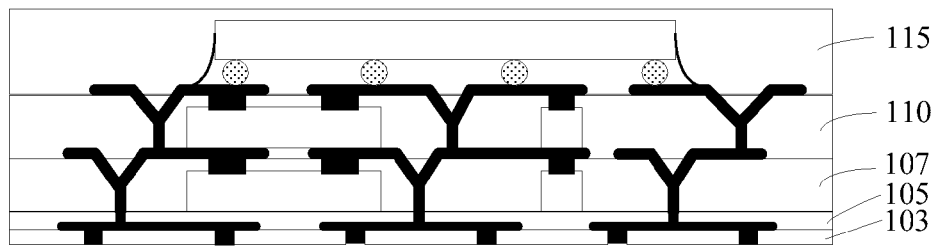

Returning to FIG. 2, after the third sealant layer 115 is formed, the substrate 101 and the stripping film 102 are removed (S117). FIG. 12 shows an exemplary structure corresponding to S117.

As shown in FIG. 12, the substrate 101 and the stripping film 102 are removed to expose an under surface or bottom surface of the metal redistribution layer 104 in the photolithography pattern openings of the first protection layer 103 as electrical output terminals.

Figure 13:
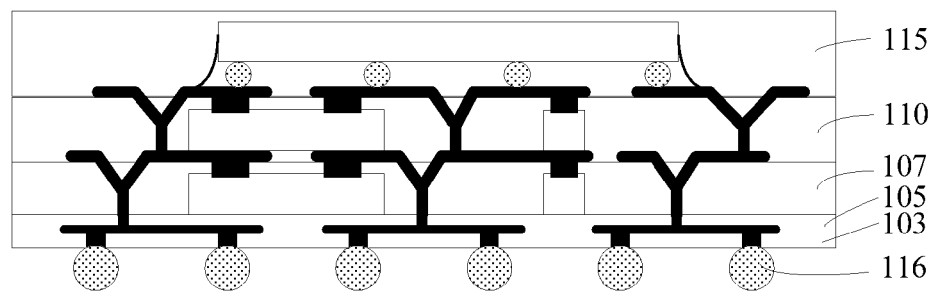

Returning to FIG. 2, after the substrate 101 and the stripping film 102 are removed, metal solder balls or bumps may be planted on the exposed electrical output terminals (S118). FIG. 13 shows an exemplary structure corresponding to S118.

As shown in FIG. 13, metal solder balls 116 are planted on the exposed electrical output terminals to form the connection balls. The solder balls 116 may include any appropriate material, such as metal tin or other types of metals.

Additionally or optionally, an under-the-ball metal layer (not shown) may be first formed on the exposed metal redistribution layer 104. The term "under-the-ball metal layer" may refer to the metal layer providing connection and support for connection balls or bumps as outputs of the system-level packaging structure. The metal solder balls are then formed on the under-the-ball metal layer over the exposed metal redistribution layer 104.

Thus, at this point, a fan-out high-density packaging structure is formed, including the plurality of package layers with the interconnect between the plurality of package layers achieved through the wiring layers. Although three package layers (i.e., the first package layer/the first straight mounting layer, the second package layer/the second straight mounting layer, and the flip package layer/the first flip mounting layer) are used for illustrative purposes, any number of package layers may be used. Further, the arrangement of the top-level mounting layer and the method of electrical connection between the top-level mounting layer and other preceding mounting layers may be changed. That is, different types of package layers may also be used as the top-level package layer.

Figure 14:
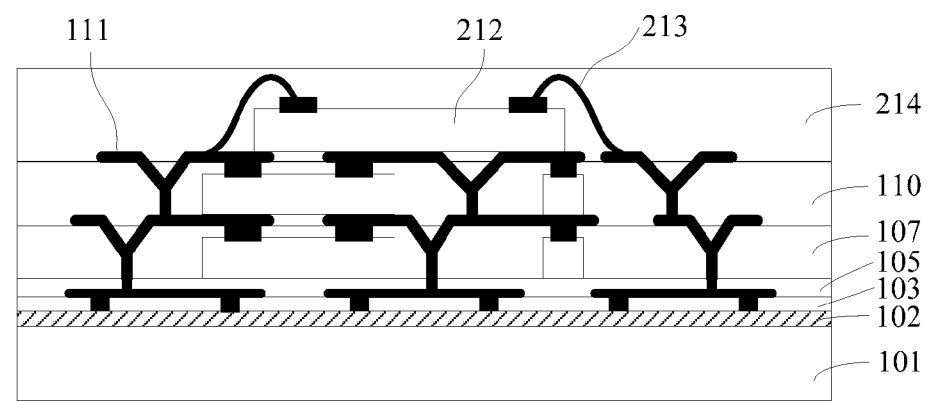
FIGS. 14-16 illustrates another exemplary fan-out packaging structure consistent with the disclosed embodiments.
Figure 15:
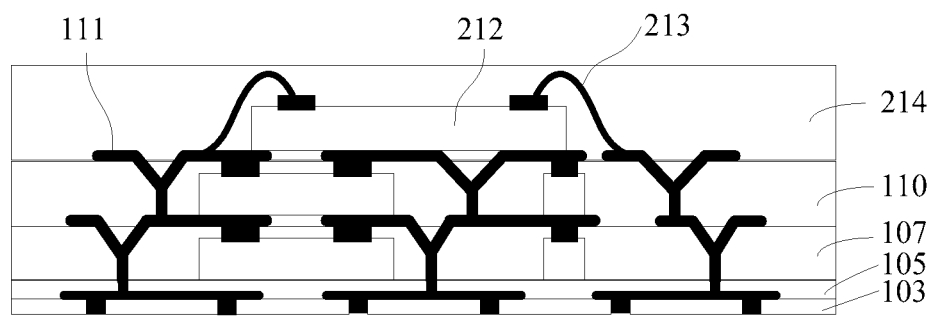
Figure 16:
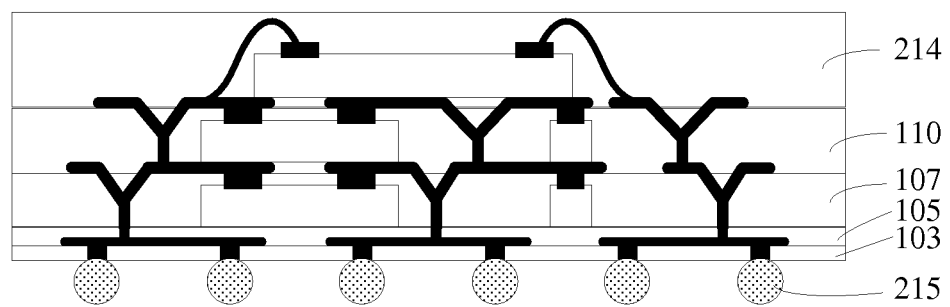

For example, alternatively or optionally, the flip package layer may be replaced by a different type of package layer in forming the system-level packaging structure. FIGS. 14-16 illustrate another exemplary fan-out high-density packaging structure.

As shown in FIG. 14, a wire-bonding package layer is formed on top of the second package layer, instead of the top-level flip package layer. More particularly, a straight mounting layer 212 is formed on the second sealant layer 110 over the second wiring layer 111. Similar to the first straight mounting layer 106, the straight mounting layer 212 may also include various components, such as chips and/or passive device. For example, at least one chip is included in the straight mounting layer 212. The chip and other component in the straight mounting layer 212 may be connected to the second wiring layer 111 by metal wires using a wire-bonding process. More specifically, the metal wires 213 are interconnected with the second horizontal wiring of the second wiring layer 111 such that components in the straight mounting layer 212 can be interconnected with other package layers.

Further, the straight mounting layer 212 is sealed or encapsulated with the third sealant layer 214. The straight mounting layer 212, the wires 213, and the third sealant layer 214 may be referred as the wire-bonding package layer or top-level wire-bonding package layer. Thus, the straight mounting layer 212 is connected with the second package layer through the metal wires 213 and is also connected with other package layer(s) through various wiring layers.

Further, as shown in FIG. 15, the substrate 101 and the stripping film 102 are removed to expose the under surface of the metal redistribution layer 104 in the photolithography pattern openings of the first protection layer 103 as electrical output terminals. As shown in FIG. 16, after the substrate 101 and the stripping film 102 are removed, metal solder balls or bumps 215 may be planted on the exposed electrical output terminals. Other package layers may also be used. Additionally or optionally, an under-the-ball metal layer (not shown) may be first formed on the exposed metal redistribution layer 104. The metal solder balls are then formed on the under-the-ball metal layer over the exposed metal redistribution layer 104.

The disclosed systems and methods may provide many advantageous IC packaging applications. The integration degree of the fan-out high-density package structures may be substantially increased because the sealant layers may have similar thickness to the mounting layers and desired insulation and isolation performance. Other applications and advantages are obvious to those skilled in the art.

What is claimed is:

1. A method for fan-out high-density packaging, comprising:
    providing a packaging substrate;
    forming a stripping film on the packaging substrate;
    forming a first protection layer on the stripping film and pre-designed photolithography pattern openings on the first protection layer;
    forming a metal redistribution layer on the surface of the first protection layer and in the photolithography pattern openings;
    forming a second protection layer on the first protection layer and partially exposing the metal redistribution layer;
    forming at least one package layer on the second protection layer, wherein each of at least one package layer includes a straight mounting layer, a sealant layer, and a wiring layer formed in sequence, and the package layer connects the metal redistribution layer through the wiring layer;
    forming at least one top-level package layer on top of the at least one package layer;
    removing the packaging substrate and the stripping film to expose the metal redistribution layer in the first protection layer; and
    planting metal solder balls over the exposed metal redistribution layer.

2. The method for fan-out high-density packaging according to claim 1, wherein planting metal solder balls over the exposed metal redistribution layer further includes:
    forming an under-the-ball metal layer on the exposed metal redistribution layer; and
    forming metal solder balls on the under-the-ball metal layer.

3. The method for fan-out high-density packaging according to claim 1, wherein forming the top-level package layer further includes:
    forming at least one flip package layer on top of the at least one package layer, wherein the flip package layer includes a flip mounting layer, an underfill, and a sealant layer.

4. The method for fan-out high-density packaging according to claim 3, wherein:
    the at least one package layer and the top-level package layer are interconnected through the wiring layer of the at least one package layer and the solder bumps.

5. The method for fan-out high-density packaging according to claim 1, wherein forming the top-level package layer further includes:
    forming at least one wire-bonding package layer on top of the at least one package layer, wherein the wire-bonding package layer includes a straight mounting layer, metal wires, and a sealant layer.

6. The method for fan-out high-density packaging according to claim 5, wherein:
    the at least one package layer and the top-level package layer are interconnected through the wiring layer of the at least one package layer and the metal wires.

7. The method for fan-out high-density packaging according to claim 1, wherein forming at least one package layer on the second protection layer further includes:
    attaching a first straight mounting layer on the second protection layer at an opposite side of a functional surface of the first straight mounting layer;
    forming a first sealant layer on the second protection layer on a same side attached with the first straight mounting layer and exposing bonding pads of the first straight mounting layer;
    forming a first wiring layer including first vertical metal wiring connecting the metal redistribution layer and a first horizontal metal wiring layer connecting the first vertical metal wiring, wherein the first vertical metal wiring is formed by forming first vias in the first sealant layer and filling conductive material in the first vias and the first horizontal metal wiring layer is formed on the first sealant layer;
    stacking a second straight mounting layer on the first sealant layer;
    forming a second sealant layer on the first sealant layer covering the second straight mounting layer and exposing bonding pads of the second straight mounting layer; and
    forming a second wiring layer including second vertical metal wiring connecting the first wiring layer and a second horizontal metal wiring layer connecting the second vertical metal wiring; wherein the second vertical metal wiring is formed by forming second vias in the second sealant layer and filling conductive material in the second vias, and the second horizontal metal wiring layer is formed on the second sealant layer.

8. The method for fan-out high-density packaging according to claim 7, wherein forming the flip package layer on the second package layer further includes:
    flipping at least one chip with solder bumps onto the second horizontal metal wiring layer on the second sealant layer to form the flip mounting layer, wherein the solder bumps are used connect the flip mounting layer and the second wiring layer;
    forming an underfill by filling space between the chip in the flip mounting layer and the second sealant layer with a filler; and
    forming a third sealant layer on the second sealant layer covering the flip mounting layer and encapsulating the flip mounting layer.

9. The method for fan-out high-density packaging according to claim 8, wherein:
    the filler in the underfill is made of polymer epoxy.

10. The method for fan-out high-density packaging according to claim 7, wherein forming the wire-bonding package layer on the second package layer further includes:
    forming at least one chip with functional surface facing up on the second package layer to form the straight mounting layer;
    connecting bonding pads of the chip in the straight mounting layer to the second package layer with wires using wire-bonding process; and
    forming a third sealant layer on the second sealant layer covering the straight mounting layer such that the straight mounting layer and the metal wires are encapsulated by the third sealant layer.

11. The method for fan-out high-density packaging according to claim 7, wherein:

each of the first mounting layer and the second mounting layer includes at least one of a chip group and a passive device group;

the chip group includes one or more chips; and the passive device group includes any one or more of capacitors, resistors, and inductors.

12. The method for fan-out high-density packaging according to claim 1, wherein:

the packaging substrate is a silica wafer or a glass substrate.

13. The method for fan-out high-density packaging according to claim 1, wherein:

the stripping film is made of a UV glue and formed the stripping film is formed by spin-coating or printing.

14. The method for fan-out high-density packaging according to claim 1, wherein:

the protecting layer is made of polyimide or benzocyclobutene.

15. The method for fan-out high-density packaging according to claim 1, wherein:

the sealant layer is made of epoxy and formed by turn injection, compression, or printing.

* * * * *